United States Patent
Ziaei et al.

(10) Patent No.: US 8,859,318 B2
(45) Date of Patent: Oct. 14, 2014

(54) METHOD FOR INTEGRATING MEMS MICROSWITCHES ON GAN SUBSTRATES COMPRISING ELECTRONIC POWER COMPONENTS

(75) Inventors: Afshin Ziaei, Vanves (FR); Matthieu Le Baillif, Orsay (FR)

(73) Assignee: Thales, Neuilly Sur Seine (FR)

( * ) Notice: Subject to any disclaimer, the term of this patent is extended or adjusted under 35 U.S.C. 154(b) by 0 days.

(21) Appl. No.: 13/696,569

(22) PCT Filed: May 7, 2010

(86) PCT No.: PCT/EP2010/056278
§ 371 (c)(1),
(2), (4) Date: Nov. 19, 2012

(87) PCT Pub. No.: WO2010/136322
PCT Pub. Date: Dec. 2, 2010

(65) Prior Publication Data
US 2013/0056751 A1    Mar. 7, 2013

(51) Int. Cl.
H01L 21/00    (2006.01)
H01L 27/14    (2006.01)
B81C 1/00    (2006.01)
H01H 59/00    (2006.01)

(52) U.S. Cl.
CPC ........ *B81C 1/00246* (2013.01); *H01H 59/0009* (2013.01); *B81C 2203/0735* (2013.01); *B81B 2201/016* (2013.01)
USPC ...................... 438/52; 257/414; 257/E29.089

(58) Field of Classification Search
CPC ............................................. H01L 2924/1461
USPC ................................................... 257/E29.089
See application file for complete search history.

(56) References Cited

U.S. PATENT DOCUMENTS

| | | |
|---|---|---|
| 6,232,150 B1 | 5/2001 | Lin et al. |
| 7,514,759 B1 | 4/2009 | Mehta et al. |
| 2003/0119221 A1 | 6/2003 | Cunningham et al. |
| 2009/0174014 A1 | 7/2009 | Kunze et al. |

FOREIGN PATENT DOCUMENTS

WO    2007/131796 A2    11/2007

OTHER PUBLICATIONS

F. Crispoldi, et al, "New Fabrication Process to Manufacture RF-MEMS and HEMT on GaN/Si Substrate", European Microwave Conference, Sep. 29, 2009, pp. 1740-1743, IEEE, Piscataway, NJ, USA, XP03151522.

*Primary Examiner* — Lex Malsawma
(74) *Attorney, Agent, or Firm* — Baker & Hostetler LLP

(57) ABSTRACT

Methods of fabrication of electronic modules comprise, on the one hand, power electronic components fabricated on a substrate made of gallium nitride (GaN) and, on the other hand, micro-switches using electrostatic activation of the MEMS (Micro Electro Mechanical System) type. The electronic components and the micro-switches are fabricated on a single gallium nitride substrate and the fabrication method comprises at least the following steps: fabrication of the power components on the gallium nitride substrate; deposition of a first common passivation layer on said components and on the substrate; fabrication of the micro-switches on said substrate.

12 Claims, 2 Drawing Sheets

Figure 1:
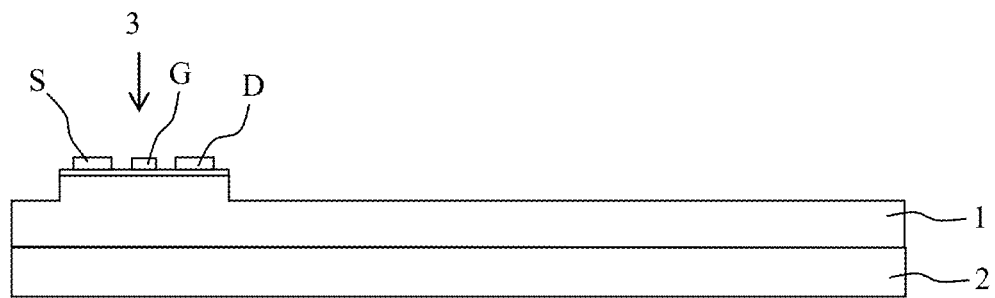

METHOD FOR INTEGRATING MEMS MICROSWITCHES ON GAN SUBSTRATES COMPRISING ELECTRONIC POWER COMPONENTS

The field of the invention is that of microelectronics. A certain number of applications require the use of electronic components fabricated on various substrates in such a manner as to perform various functions.

Thus, gallium nitride (GaN), which is a wideband semiconductor, is commonly used as a substrate to fabricate optoelectronic devices or very high power devices or devices operating at high frequency. These devices are notably used in systems for transmission/reception of high frequency signals comprising components known as "LNA" or "HPA" respectively signifying "Low Noise Amplifier" or "High Power Amplifier". The components of these devices then perform the conditioning of these signals, their amplification, and the measurement of their electronic characteristics. These systems also require switches disposed between the core of the electronic system and the transmitter/receiver antenna, the switches allowing the signals to be routed depending on whether the system operates in transmission or reception mode. Generally speaking, these micro-switches are fabricated using MEMS technology, where the acronym MEMS stands for "Micro Electro Mechanical System". This technology will not be detailed as it is well known from elsewhere. The principle of operation of a micro-switch is to cause the displacement of a micro-membrane by subjecting it to an electrostatic force, the displacement or the deformation of the membrane subjected to this force causing an electronic parameter, such as the value of a resistance or of a capacitance, to vary. Currently, the micro-switches are fabricated on $Si/SiO_2$ substrates, incompatible with the fabrication of electronic components on a GaN substrate. Moreover, the methods of fabrication of electronic components and of MEMS require very different fabrication temperatures. Lastly, the steps for deposition and for etching away of sacrificial layers in order to form the suspended membranes can seriously damage the various layers of power components. In addition, these various electronic components are connected via electrical connections, the method being better known by the term "bonding". These electrical connections however exhibit electrical losses which can be detrimental to the correct operation of the assembly. Thus, a "bonding" formed between a MEMS device and an electronic device on GaN has a loss of 0.5 dB. A single electronic module necessarily possesses several "bondings", which accordingly increases the losses. Furthermore, the size of the final module is thus increased.

The fabrication method according to the invention aims to overcome these drawbacks. More precisely, the subject of the invention is a method of fabrication of an electronic module comprising, on the one hand, power electronic components fabricated on a substrate made of gallium nitride (GaN) and, on the other hand, micro-switches using electrostatic activation of the MEMS type (Micro Electro Mechanical System), characterized in that the electronic components and the micro-switches are fabricated on a single gallium nitride substrate and that the method comprises at least the following fabrication steps:
  Step 1: Fabrication of the power components on the gallium nitride substrate;
  Step 2: Deposition of a first common passivation layer on said components and over the entire substrate;
  Step 3: Fabrication of the micro-switches on said substrate.
  Advantageously, the step 2 is followed by a step 2b preceding the step 3, the step 2b consisting of the formation of a second passivation layer at the locations of the micro-switches. Advantageously, the step 2b is followed by a step 2c preceding the step 3, the step 2c consisting in locally eliminating the first passivation layer on top of the electrical interconnection regions of the electronic components and in depositing a conductive layer on top of said electrical interconnection regions.

Advantageously, the step 3 essentially consists in depositing electrically conducting lugs at the locations of the micro-switches and in forming on top of said lugs at least one suspended membrane, the whole assembly constituting said micro-switches.

Preferably, the passivation layers are made of silicon oxide ($SiO_2$) or of silicon nitride ($Si_3N_4$).

The invention also relates to an electronic module comprising power electronic components fabricated on a substrate made of gallium nitride (GaN) using transistors of the "HEMT" (High Electron Mobility Transistor) type, characterized in that the power electronic components are covered by a passivation layer and that the module also comprises, on the same substrate, micro-switches using electrostatic activation of the MEMS type, where said module can be a radiofrequency transmission-reception module.

The invention will be better understood and other advantages will become apparent upon reading the description that follows presented by way of non-limiting example and thanks to the appended figures amongst which:

FIGS. 1 to 5 show the main steps in a method of fabrication of an electronic module according to the invention.

All the steps that follow are carried out by the techniques of photolithography widely used for the fabrication of electronic components.

In a first step illustrated in FIG. 1, power components are fabricated on the gallium nitride substrate 1. In FIG. 1, the gallium nitride substrate 1 is formed on a first silicon substrate 2. The power component 3 shown in FIG. 1 is a transistor conventionally comprising a drain, a gate and a source formed within a layer of aluminum-gallium nitride (AlGaN). This transistor comprises three conducting lugs respectively denoted D, G and S. The electronic components fabricated can, by way of example, be "LNAs", "DRAs" or "HPAs" respectively signifying "Low Noise Amplifier", "Digital Research Amplifier" and "High Power Amplifier" used in systems for transmission/reception of high frequency signals.

Figure 2:
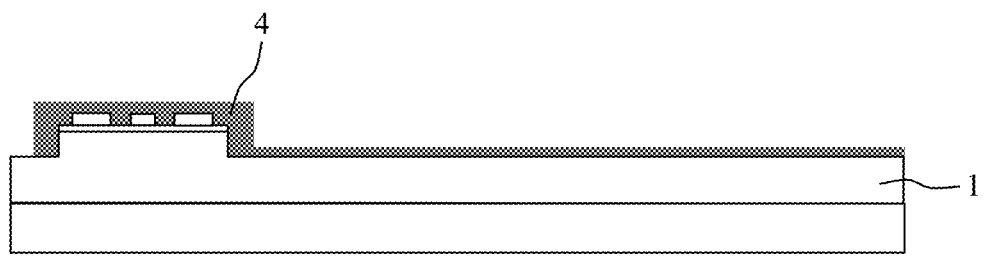

In a second step illustrated in FIG. 2, a first passivation layer 4 is deposited, common to the whole of the GaN substrate wafer 1, covering the power components 3 and necessary for their completion and for their protection and for the fabrication of the micro-switches. The passivation layer can be made of silicon oxide ($SiO_2$). The passivation layer thus fulfils a dual role. The power components 3 and, in particular, the regions formed of doped semiconductors are protected during the later steps of the fabrication method and especially during the steps for deposition and for elimination of the sacrificial layers of resist. The passivation layer also participates in the fabrication of the micro-switches.

In the following step 2b shown in FIG. 3, the various electrodes 5 are formed that are needed for the operation of the micro-switches, then a second passivation layer 6 is deposited at the locations of the micro-switches. The passivation layer can be made of silicon nitride ($Si_3N_4$).

Figure 3:
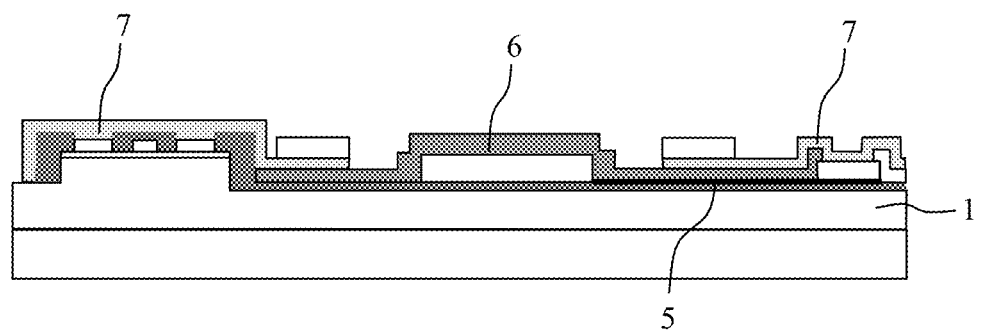

Also shown in FIG. 3, the step 2b is followed by a step 2c. The step 2c consists in locally eliminating the first passivation layer 4 on top of the electrical interconnection regions of the electronic components and in depositing a conductive metallization layer 7 on top of the said electrical interconnection regions.

Figure 4:
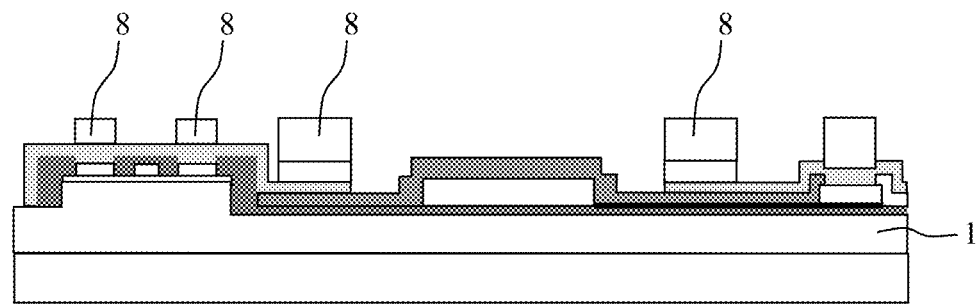
Figure 5:
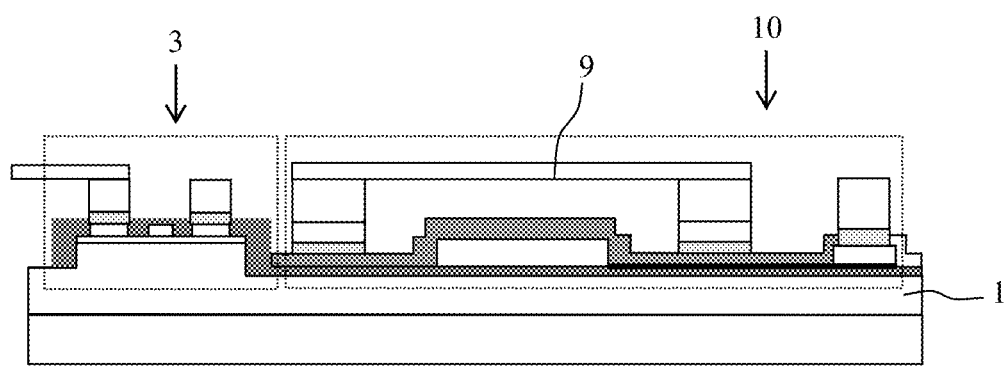

In the step 3 shown in FIGS. 4 and 5, the micro-switches 10 are fabricated on said substrate. The step 3 essentially consists in depositing electrically conducting lugs 8 at the locations of the micro-switches as illustrated in FIG. 4. Then, as indicated in FIG. 5, at least one suspended membrane 9 is formed above said lugs, the whole assembly constituting the micro-switches. The membrane is formed by the deposition and the partial elimination of sacrificial layers of resist.

The micro-switch can be a switch with two channels of the type "SPDT" signifying "Single Port Dual Throw". In FIG. 5, the two rectangles with dashed lines represent the limits of the electronic component 3 and of the micro-switch 10.

The materials used for the fabrication of the various elements can, by way of example, be gold, platinum, tungsten or titanium.

The invention claimed is:

1. A method of fabricating an electronic module comprising power electronic components fabricated on a substrate made of gallium nitride (GaN) and micro-switches using electrostatic activation of a MEMS (Micro Electro Mechanical System) type, wherein the power electronic components and the micro-switches are fabricated on a single substrate of gallium nitride and the method comprises:
   Step 1: fabricating the power electronic components on the gallium nitride substrate;
   Step 2: depositing a first common passivation layer on the power electronic components and over the entire gallium nitride substrate;
   Step 3: fabricating the micro-switches on the gallium nitride substrate.

2. The method of fabricating an electronic module of claim 1, wherein step 2 is followed by a step 2b preceding step 3, step 2b comprising forming a second passivation layer at a location of the micro-switches.

3. The method of fabricating an electronic module of claim 2, wherein step 2b is followed by a step 2c preceding step 3, step 2c comprising locally eliminating the first common passivation layer on top of electrical interconnection regions of the power electronic components and in depositing a conductive layer on top of the electrical interconnection regions.

4. The method of fabricating an electronic module of claim 3, wherein step 3 further comprises depositing electrically conducting lugs at locations of the micro-switches and in forming on top of the electrically conducting lugs at least one suspended membrane, wherein the micro-switches constitute a whole assembly.

5. The method of fabricating an electronic module of claim 3, wherein the passivation layers are made of silicon oxide ($SiO_2$) or of silicon nitride ($Si_3N_4$).

6. The method of fabricating an electronic module of claim 2, wherein step 3 further comprises depositing electrically conducting lugs at locations of the micro-switches and in forming on top of the electrically conducting lugs at least one suspended membrane, wherein the micro-switches constitute a whole assembly.

7. The method of fabricating an electronic module of claim 2, wherein the passivation layers are made of silicon oxide ($SiO_2$) or of silicon nitride ($Si_3N_4$).

8. The method of fabricating an electronic module of claim 1, wherein step 3 further comprises depositing electrically conducting lugs at locations of the micro-switches and in forming on top of the electrically conducting lugs at least one suspended membrane, wherein the micro-switches constitute a whole assembly.

9. The method of fabricating an electronic module of claim 8, wherein the passivation layer is made of silicon oxide ($SiO_2$) or of silicon nitride ($Si_3N_4$).

10. The method of fabricating an electronic module of claim 1, wherein the first common passivation layer is made of silicon oxide ($SiO_2$) or of silicon nitride ($Si_3N_4$).

11. An electronic module comprising power electronic components fabricated on a substrate made of gallium nitride (GaN) using transistors of an "HEMT" (High Electron Mobility Transistor) type, wherein the power electronic components and the entire substrate except on top of electrical interconnection regions are covered by a passivation layer and the electronic module also comprises, on the same gallium nitride substrate, micro-switches using electrostatic activation of a MEMS type.

12. The electronic module of claim 11, wherein the electronic module is a radiofrequency transmission-reception module.

* * * * *